(12) United States Patent
Saso et al.

(10) Patent No.: US 7,145,169 B2
(45) Date of Patent: Dec. 5, 2006

(54) FIELD-EFFECT TRANSISTOR, SEMICONDUCTOR DEVICE, AND PHOTO RELAY

(75) Inventors: Ryujiro Saso, Tokyo (JP); Mitsuhiko Kitagawa, Tokyo (JP); Takashi Nishimura, Kanagawa (JP); Yoshiaki Aizawa, Kanagawa (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 53 days.

(21) Appl. No.: 11/001,640

(22) Filed: Dec. 2, 2004

(65) Prior Publication Data

US 2005/0230675 A1 Oct. 20, 2005

(30) Foreign Application Priority Data

Dec. 5, 2003 (JP) ............................. 2003-407840
Nov. 9, 2004 (JP) ............................. 2004-325505

(51) Int. Cl.
*H01L 29/06* (2006.01)

(52) U.S. Cl. ................... 257/19; 257/20; 257/E29.193
(58) Field of Classification Search ................. 257/19
See application file for complete search history.

(56) References Cited

U.S. PATENT DOCUMENTS 6,933,518 B1 * 8/2005 Braithwaite et al. .......... 257/18

* cited by examiner

*Primary Examiner*—Tu-Tu Ho
(74) *Attorney, Agent, or Firm*—Banner & Witcoff, Ltd

(57) ABSTRACT

A field-effect transistor includes a silicon layer formed on an insulating film, a first-conductivity-type base and a second-conductivity-type source layers formed in the silicon layer being adjacent to each other, a second-conductivity-type drain layer formed in the silicon layer being separated from the source layer with the base layer being interposed therebetween, a gate-to-drain offset layer formed between the base and drain layers, having a resistance higher than that of the base layer, and a gate electrode formed on at least a surface of the base layer via a gate insulating film wherein the silicon layer in which the base layer is formed is a strained silicon layer.

30 Claims, 5 Drawing Sheets

FIELD-EFFECT TRANSISTOR, SEMICONDUCTOR DEVICE, AND PHOTO RELAY

CROSS REFERENCE TO RELATED APPLICATION

This application is based upon and claims benefit of priority under 35 USC §119 from the Japanese Patent Applications No. 2003-407840, filed on Dec. 5, 2003, and No. 2004-325505, filed on Nov. 9, 2004, the entire contents of which are incorporated herein by reference.

BACKGROUND OF THE INVENTION

The present invention relates to a field-effect transistor, and a semiconductor device and photo relay including the field-effect transistor and, more particularly, to an analog switch (relay or antenna switch) and photo relay for controlling a signal line, a power transistor for handling energy, and the like.

Although the conventionally extensively used mechanical contact type relay has excellent high-frequency characteristics, demands for replacing this relay with a photo relay using a field-effect transistor are increasing. For this purpose, it is necessary to reduce an ON resistance Ron and OFF capacitance Cout of the field-effect transistor.

Unfortunately, the ON resistance Ron and OFF capacitance Cout of the field-effect transistor have tradeoff.

It is difficult to reduce both the ON resistance Ron and OFF capacitance Cout of the conventional field-effect transistor, and Cout×Ron>10 [pF·Ω] is the limit.

Reportedly, it is possible to increase the channel mobility of the field-effect transistor, which is used as an information processing transistor having a breakdown voltage of a few volts in an LSI or the like, by using an intentionally strained silicon layer, i.e., a strained silicon layer. However, a thickness by which this strain stably exists is usually a few nm to a few tens of nm. Accordingly, it is regarded as impossible to apply this transistor to, e.g., an analog switch (relay), photo relay, or power transistor required to have an element breakdown voltage of a few tens of volts or more.

A reference disclosing a technique concerning the conventional semiconductor relay is as follows.
1: Japanese Patent Laid-Open No. 9-312392

Also, a reference disclosing a technique concerning a photo relay having the conventional SOI structure is as follows.
2: Japanese Patent Laid-Open No. 11-186562

As described above, although the reliability of the mechanical contact type relay is inferior to that of the semiconductor relay, it is difficult to obtain a low ON resistance Ron and small OFF capacitance Cout which are sufficient to replace the mechanical contact type relay, and ensure a desired element breakdown voltage.

SUMMARY OF THE INVENTION

According to one aspect of the present invention, there is provided a field-effect transistor, comprising:
a silicon layer formed on an insulating film;
a first-conductivity-type base layer formed in said silicon layer;
a second-conductivity-type source layer formed in said silicon layer so as to be adjacent to said first-conductivity-type base layer;
a second-conductivity-type drain layer formed in said silicon layer so as to be separated from said second-conductivity-type source layer with said first-conductivity-type base layer being interposed therebetween;
a gate-to-drain offset layer formed between said first-conductivity-type base layer and said second-conductivity-type drain layer in said silicon layer, and having a resistance higher than that of said first-conductivity-type base layer; and
a gate electrode formed on at least a surface of said first-conductivity-type base layer via a gate insulating film,
wherein said silicon layer in which said first-conductivity-type base layer is formed is a strained silicon layer.

According to one aspect of the present invention, there is provided a semiconductor device comprising:
a semiconductor substrate;
an insulating film formed on said semiconductor substrate;
a silicon layer formed on said insulating film;
a first field-effect transistor comprising
a first first-conductivity-type base layer formed in said silicon layer,
a first second-conductivity-type source layer formed in said silicon layer so as to be adjacent to said first-conductivity-type base layer,
a first second-conductivity-type drain layer formed in said silicon layer so as to be separated from said first second-conductivity-type source layer with said first-conductivity-type base layer being interposed therebetween,
a first gate-to-drain offset layer formed between said first first-conductivity-type base layer and first second-conductivity-type drain layer in said silicon layer, and having a resistance higher than that of said first first-conductivity-type base layer, and
a first gate electrode formed on at least a surface of said first first-conductivity-type base layer via a first gate insulating film; and
a second field-effect transistor comprising
said first second-conductivity-type source layer shared by said first field-effect transistor,
a second first-conductivity-type base layer formed in said silicon layer so as to be adjacent to said first second-conductivity-type source layer,
a second second-conductivity-type drain layer formed in said silicon layer so as to be separated from said first second-conductivity-type source layer with said second first-conductivity-type base layer being interposed therebetween,
a second gate-to-drain offset layer formed between said second first-conductivity-type base layer and second second-conductivity-type drain layer in said silicon layer, and having a resistance higher than that of said second first-conductivity-type base layer, and
a second gate electrode formed on at least a surface of said second first-conductivity-type base layer via a second gate insulating film,
wherein said silicon layer in which said first and second first-conductivity-type base layers are formed is a strained silicon layer.

According to one aspect of the present invention, there is provided a semiconductor device comprising:
a semiconductor substrate;
an insulating film formed on said semiconductor substrate;
a silicon layer formed on said insulating film;
a first field-effect transistor comprising a first first-conductivity-type base layer formed in said silicon layer, a first second-conductivity-type layer as a first second-conductivity-type source layer formed in said silicon layer so as to be adjacent to said first-conductivity-type base layer, a first second-conductivity-type drain layer formed in said silicon layer so as to be separated from said first second-conductivity-type layer with said first-conductivity-type base layer being interposed therebetween, a first gate-to-drain offset layer formed between said first first-conductivity-type base layer and said first second-conductivity-type drain layer in said silicon layer, and having a resistance higher than that of said first first-conductivity-type base layer, and a first gate electrode formed on at least a surface of said first first-conductivity-type base layer via a first gate insulating film; and a second field-effect transistor comprising said first second-conductivity-type layer, as a second second-conductivity-type drain layer, shared by said first field-effect transistor, a second first-conductivity-type base layer formed in said silicon layer so as to be separated from said first second-conductivity-type layer, a second second-conductivity-type source layer formed in said silicon layer so as to be adjacent to said second first-conductivity-type base layer and separated from said first second-conductivity-type layer with said second first-conductivity-type base layer being interposed therebetween, a second gate-to-drain offset layer formed between said second first-conductivity-type base layer and said first second-conductivity-type layer in said silicon layer, and having a resistance higher than that of said second first-conductivity-type base layer, and a second gate electrode formed on at least a surface of said second first-conductivity-type base layer via a second gate insulating film, wherein said silicon layer in which said first and second first-conductivity-type base layers are formed is a strained silicon layer.

According to one aspect of the present invention, there is provided a photo relay comprising:

a light-emitting element which emits light when a switching control signal is input;

a light-receiving element which receives the light emitted by said light-emitting element, and generates a light-receiving voltage;

first and second field-effect transistors which are turned on or off in accordance with the light-receiving voltage, each of said first and second field-effect transistors comprising an insulating film formed on a semiconductor substrate, and a silicon layer formed on said insulating film;

a first-conductivity-type base layer formed in said silicon layer;

a second-conductivity-type source layer formed in said silicon layer so as to be adjacent to said first-conductivity-type base layer;

a second-conductivity-type drain layer formed in said silicon layer so as to be separated from said second-conductivity-type source layer with said first-conductivity-type base layer being interposed therebetween;

a gate-to-drain offset layer formed between said first-conductivity-type base layer and said second-conductivity-type drain layer in said silicon layer, and having a resistance higher than that of said first-conductivity-type base layer; and a gate electrode formed on at least a surface of said first-conductivity-type base layer via a gate insulating film, wherein said silicon layer in which said first-conductivity-type base layer is formed is a strained silicon layer, and said second-conductivity-type source layers of said first and second field-effect transistors are connected together, said gate electrodes of said first and second field-effect transistors are connected together, and said first and second field-effect transistors are turned on or off in accordance with the light-receiving voltage applied between said second-conductivity-type source layers and said gate electrodes.

DETAILED DESCRIPTION OF THE INVENTION

Embodiments of the present invention will be described below with reference to the accompanying drawings.

(1) First Embodiment

Figure 1:
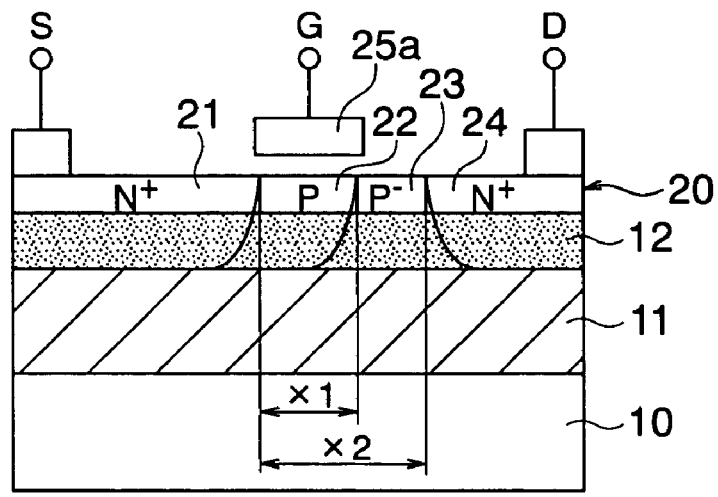
FIG. 1 is a longitudinal sectional view showing the arrangement of a field-effect transistor according to the first embodiment of the present invention.

FIG. 1 shows the arrangement of a field-effect transistor according to the first embodiment of the present invention. The first embodiment is characterized by using a strained silicon layer as a semiconductor layer in an SOI substrate.

A silicon oxide film 11 is formed on a semiconductor substrate 10, and a silicon germanium layer 12 is formed on the surface of the silicon oxide film 11.

When a thin silicon film is formed on the silicon germanium layer 12, the strain of silicon increases, and this widens the lattice spacing of silicon. As a consequence, the channel mobility increases, and the ON resistance Ron reduces.

A P-type base layer 22 is formed by doping an impurity in a strained silicon layer 20 thus formed and having a film thickness of, e.g., 0.1 µm or less. An N⁺-type source layer 21 is selectively formed in the P-type base layer 22 formed in the strained silicon layer 20, so as to be adjacent to the P-type base layer 22. In the strained silicon layer 20, an N⁺-type drain layer 24 is formed to be separated from the N⁺-type source layer 21 with the P-type base layer 22 being interposed between them.

In addition, a P⁻-type gate-to-drain offset layer 23 is formed between and adjacent to the P-type base layer 22 and N⁺-type drain layer 24. Above a channel region in the P-type base layer 22, a gate electrode 25a is formed via a gate insulating film (not shown).

Figure 2:
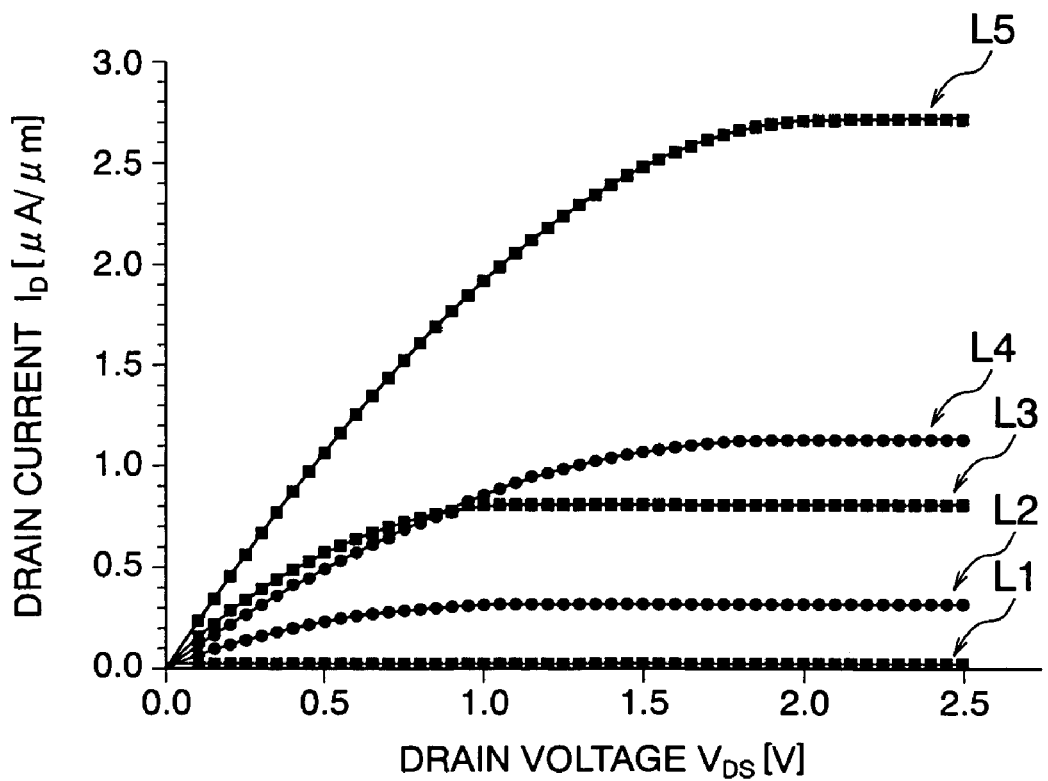
FIG. 2 is a graph showing the characteristics of a field-effect transistor using strained silicon and a field-effect transistor using the conventional SOI substrate.

FIG. 2 shows a drain current $I_D$ as a function of a drain voltage $V_{DS}$. A curve L1 indicates a drain current when a gate voltage Vg is 0 [V], a curve L2 indicates a drain current when the gate voltage Vg is 1 [V] and the substrate is a conventional SOI substrate, a curve L3 indicates a drain current when the gate voltage Vg is 1 [V] and a strained silicon layer is used, a curve L4 indicates a drain current when the gate voltage Vg is 2 [V] and the substrate is a conventional SOI substrate, and a curve L5 indicates a drain current when the gate voltage Vg is 2 [V] and a strained silicon layer is used.

As is apparent from comparison between the curves L2 and L3 and between the curves L4 and L5, the drain current ID when the strained silicon layer is used is about twice as large as that when the conventional SOI substrate is used, for the same gate voltage Vg. That is, the ON resistance Ron is reduced to about ½.

In the first embodiment, therefore, the use of the strained silicon layer 20 increases the channel mobility and reduce the ON resistance Ron.

Also, the OFF capacitance Cout can be reduced by forming the strained silicon layer 20 as thin as, e.g., 0.1 µm or less.

Furthermore, the P⁻-type gate-to-drain offset layer 23 increases a distance X1 of only the P-type base layer 22 to a distance X2 as the sum of the P-type base layer 22 and P⁻-type gate-to-drain offset layer 23. As a consequence, the OFF capacitance Cout can be reduced.

In addition, although the thin strained silicon layer 20 is used, the P⁻-type high-resistance gate-to-drain offset layer 23 is formed between the P-type base layer 22 and N⁺-type drain layer 24. Since this reduces field concentration to the end portion of the P-type base layer 22, the element breakdown voltage can be increased.

In the field-effect transistor according to the first embodiment, therefore, it is possible to reduce the ON resistance and OFF capacitance, and increase the element breakdown voltage.

Figure 3:
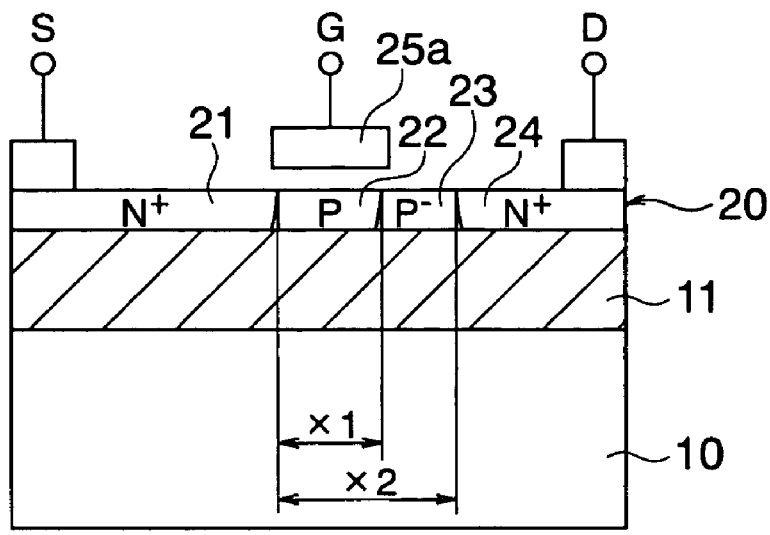
FIG. 3 is a longitudinal sectional view showing the arrangement of a field-effect transistor according to a modification of the first embodiment.

A modification of the first embodiment will be described below with reference to FIG. 3. This modification is equivalent to removing the silicon germanium layer 12 in the first embodiment shown in FIG. 1. The rest of the arrangement is the same as the first embodiment, so a detailed explanation thereof will be omitted.

The fabrication method is as follows. First, as in the first embodiment described above, an SOI substrate having a silicon oxide film formed on its surface is prepared. A silicon germanium layer is formed on the surface of the silicon oxide film, and a thin silicon film is formed on this silicon germanium layer. Since this increases the strain of silicon and widens the lattice spacing of silicon, a strained silicon layer is formed.

Another SOI substrate is prepared, and the surface of a silicon oxide film of this SOI substrate is adhered to the surface of the strained silicon layer. When the two substrates are separated from the interface between the strained silicon layer and silicon germanium layer, the strained silicon layer is left behind on the silicon oxide film.

In this modification, the silicon germanium film is omitted, so the device structure has no interface between the strained silicon layer and the silicon germanium layer. This increases the yield and improves the element characteristics. Especially when an electric field is applied inside the element, no interface between the strained silicon layer and the silicon germanium layer crosses the electric field. As a consequence, the element breakdown voltage can be increased.

(2) Second Embodiment

Figure 4:
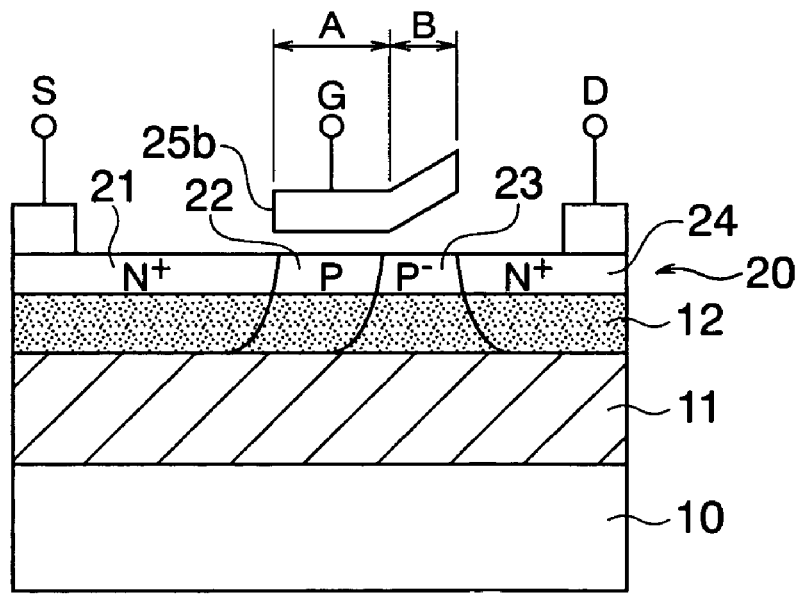
FIG. 4 is a longitudinal sectional view showing the arrangement of a field-effect transistor according to the second embodiment of the present invention.

FIG. 4 shows the arrangement of a field-effect transistor according to the second embodiment of the present invention.

In this transistor, the formation region and shape of a gate electrode 25b are different from those of the first embodiment described above.

The gate electrode 25a in the first embodiment is formed above the P-type base layer 22.

By contrast, the gate electrode 25b in the second embodiment is formed not only above a P-type base layer 22 but also above a P⁻-type gate-to-drain offset layer 23. A region A of the gate electrode 25b has a flat shape above the P-type base layer 22. Above the P⁻-type gate-to-drain offset layer 23, a region B of the gate electrode 25b has a so-called terrace gate structure which gradually increases the distance from a strained silicon layer 20.

In the second embodiment, as in the first embodiment, the strained silicon layer 20 reduces the ON resistance Ron, and the P⁻-type gate-to-drain offset layer 23 reduces the OFF capacitance Cout.

Also, in the second embodiment, the gate electrode 25b having the terrace gate structure gradually lowers the applied gate voltage in the direction from the P-type base layer 22 to the P⁻-type gate-to-drain offset layer 23. As a consequence, a phenomenon in which an electric field concentrates to the end portion of the P-type region can be alleviated. Accordingly, the second embodiment can make the element breakdown voltage higher than that in the first embodiment. Furthermore, the gate electrode 25b extends to the position above the P⁻-type gate-to-drain offset layer 23. This allows easy application of an electric field to the P⁻-type gate-to-drain offset layer 23, and reduces the resistance of this portion.

Figure 5:
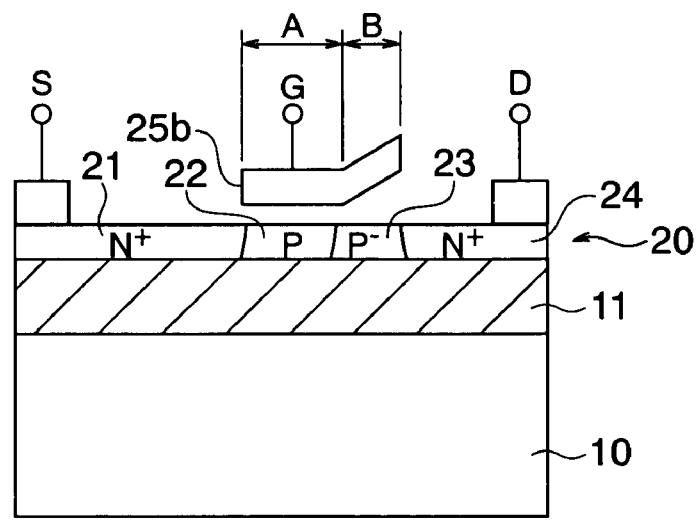
FIG. 5 is a longitudinal sectional view showing the arrangement of a field-effect transistor according to a modification of the second embodiment.

FIG. 5 shows the arrangement of a modification of the second embodiment. This modification is equivalent to omitting the silicon germanium layer 12 in the second embodiment shown in FIG. 4. The rest of the arrangement is the same as the second embodiment, so an explanation thereof will be omitted.

(3) Third Embodiment

A photo relay according to the third embodiment of the present invention will be described below with reference to FIG. 6.

A switching control signal is input to the two ends of a light-emitting diode 100 to cause it to emit light.

A light-receiving element relay 102 in which a plurality of light-receiving diodes 101 are connected in series receives the light, and the light-receiving voltage is applied, via a discharge circuit 103, between the sources and gates of MOSFETs 104 and 105 connected in parallel on the output stage. A power supply voltage $V_{cc}$ is applied to the drain of the MOSFET 104, and an output terminal 106 is connected to the drain of the MOSFET 105.

To turn off the MOSFETs 104 and 105, the discharge circuit 103 sets the gate voltage at 0 [V] by discharging electric charge stored in a gate oxide film.

The MOSFETs 104 and 105 are the field-effect transistors according to the first embodiment, the second embodiment, or the modification of the second embodiment. In this manner, the third embodiment reduces the ON resistance Ron and OFF capacitance Cout, and increases the breakdown voltage.

(4) Fourth Embodiment

The structure of a field-effect transistor included in a semiconductor device according to the fourth embodiment of the present invention will be described below with reference to FIG. 7.

This field-effect transistor is obtained by connecting two field-effect transistors in parallel. More specifically, these two field-effect transistors share the source. The structure of each field-effect transistor can be the same as the MOSFETs 104 and 105 in the third embodiment described above.

A silicon oxide film 31 and silicon germanium layer 32 are formed in order on a semiconductor substrate 30, and a strained silicon layer 40 is formed on the silicon germanium layer 32.

In the strained silicon layer 40, one MOSFET is formed by a P-type base layer 42, an $N^+$-type source layer 41 selectively formed in the P-type base layer 42 so as to be adjacent to it, an $N^+$-type drain layer 44 separated from the $N^+$-type source layer 41 with the P-type base layer 42 being interposed between them, and a $P^-$-type gate-to-drain offset layer 43 formed between the P-type base layer 42 and the $N^+$-type drain layer 44 so as to be adjacent to them. A gate electrode 51 is formed above the P-type base layer 42.

Another MOSFET is formed by a P-type base layer 45, the same $N^+$-type source layer 41 as the MOSFET described above, an $N^+$-type drain layer 47 separated from the $N^+$-type source layer 41 with the P-type base layer 45 being interposed between them, and a $P^-$-type gate-to-drain offset layer 46 formed between the P-type base layer 45 and the $N^+$-type drain layer 47 so as to be adjacent to them. A gate electrode 52 is formed above the P-type base layer 45.

Although the gate insulating film can be a single-layered oxide film, better characteristics can be realized by a structure such as an ONO film or SiON film. The thickness of the buried oxide film 31 is preferably as large as possible, e.g., 1 to 3 μm. If possible, this thickness is preferably 5 to 10 μm or larger. When the oxide film 31 is thick, the semiconductor substrate 30 can be omitted.

In the fourth embodiment, as in the first and second embodiments described above, it is possible to reduce the ON resistance Rout and OFF capacitance Cout, and increase the element breakdown voltage.

Figure 8:
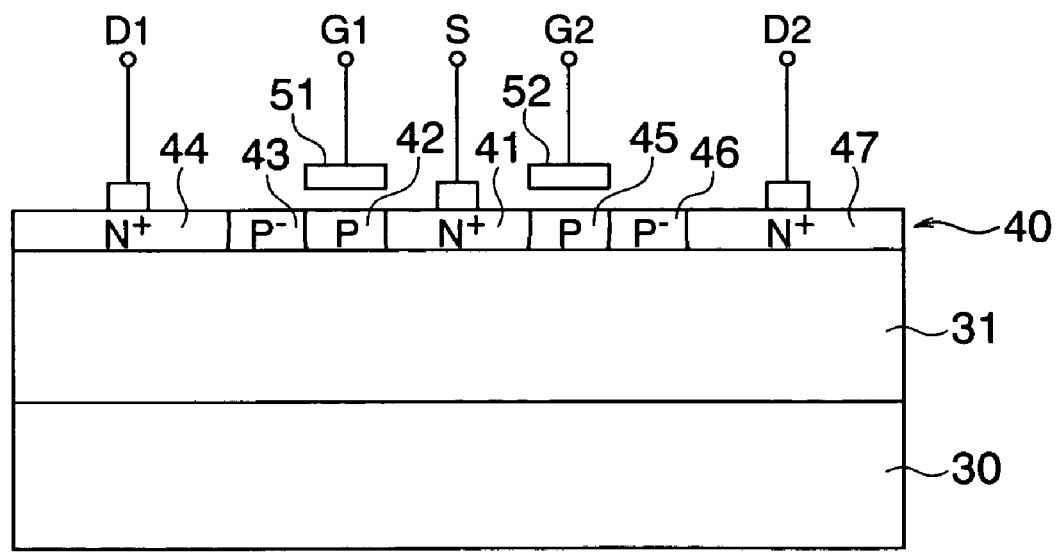
FIG. 8 is a longitudinal sectional view showing the arrangement of a field-effect transistor according to the first modification of the fourth embodiment.
Figure 9:
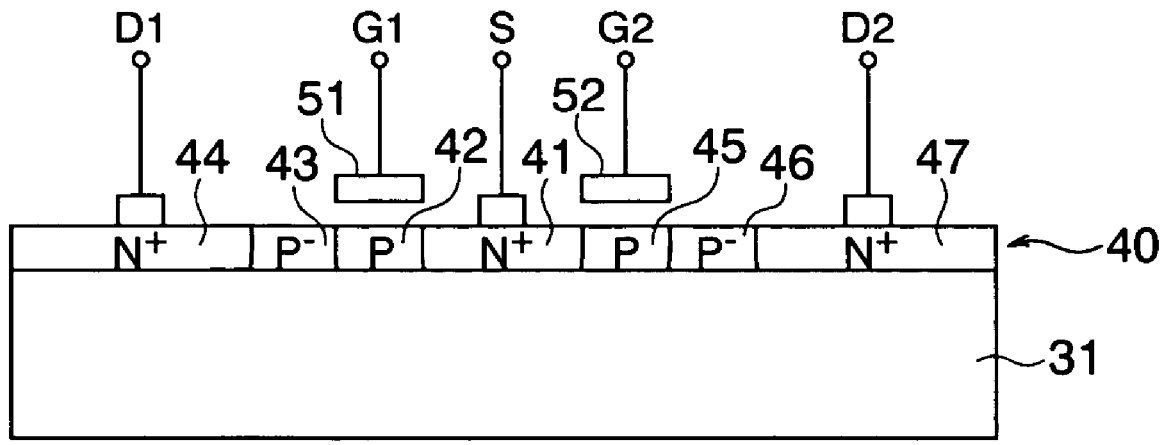
FIG. 9 is a longitudinal sectional view showing the arrangement of a field-effect transistor according to the second modification of the fourth embodiment.
Figure 10:
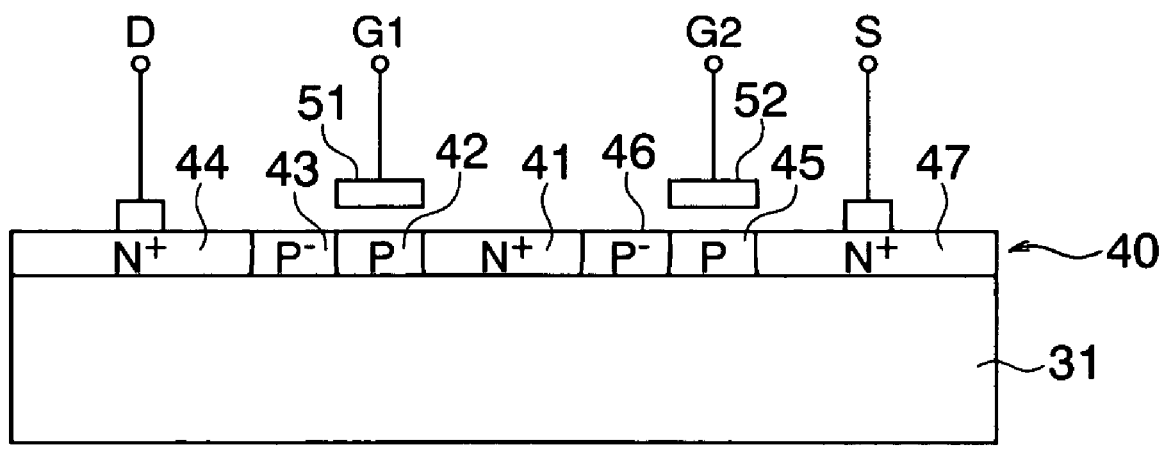
FIG. 10 is a longitudinal sectional view showing the arrangement of a field-effect transistor according to the third modification of the fourth embodiment, in which two field-effect transistors usable in the photo relay are connected in series.

FIGS. 8, 9, and 10 show the arrangements of the first, second, and third modifications, respectively, of the fourth embodiment.

Figure 7:
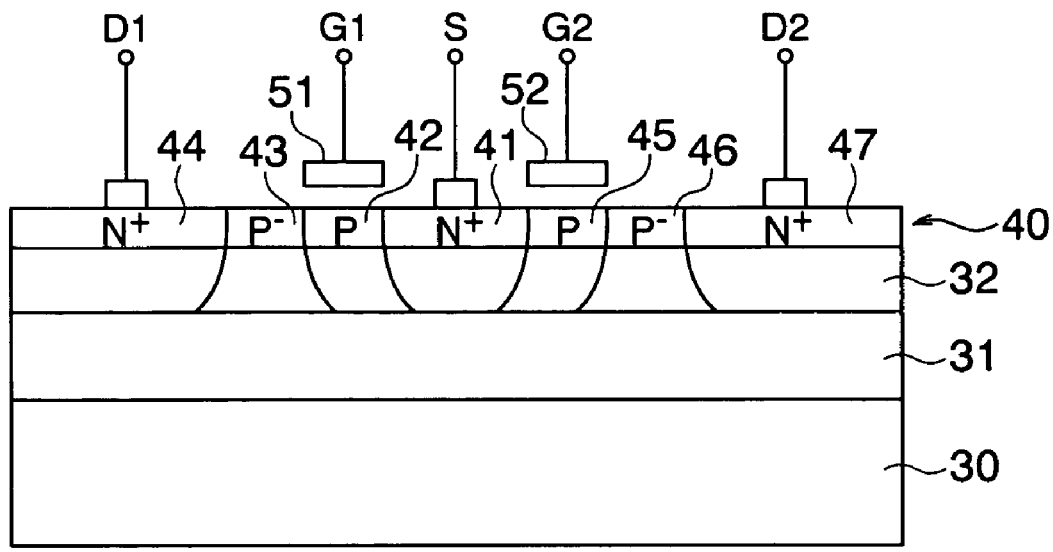
FIG. 7 is a longitudinal sectional view showing the arrangement of a semiconductor device according to the fourth embodiment of the present invention, in which two field-effect transistors usable in the photo relay are connected in parallel.

The first modification shown in FIG. 8 is equivalent to omitting the silicon germanium layer 32 in the fourth embodiment shown in FIG. 7. The rest of the arrangement is the same as the fourth embodiment, so an explanation thereof will be omitted.

The second modification shown in FIG. 9 is equivalent to omitting the silicon germanium layer 32 and semiconductor substrate 30 in the fourth embodiment. The rest of the arrangement is the same as the fourth embodiment, so an explanation thereof will be omitted.

By increasing the thickness of the silicon oxide film to, e.g., 3 μm or more, the semiconductor substrate can be omitted, and the thickness of the device can be further decreased.

The third modification shown in FIG. 10 differs from the fourth embodiment and the first and second modifications in that two field-effect transistors are connected in series. More specifically, the source of one field-effect transistor and the drain of the other field-effect transistor are connected and shared.

A strained silicon layer 40 is formed on a silicon oxide film 31.

In the strained silicon layer 40, one MOSFET is formed by a P-type base layer 42, an $N^+$-type source layer 41 selectively formed in the P-type base layer 42 so as to be adjacent to it, an $N^+$-type drain layer 44 separated from the $N^+$-type source layer 41 with the P-type base layer 42 being interposed between them, and a $P^-$-type gate-to-drain offset layer 43 formed between the P-type base layer 42 and the $N^+$-type drain layer 44 so as to be adjacent to them. A gate electrode 51 is formed above the P-type base layer 42.

Another MOSFET is formed by a P-type base layer 45, an $N^+$-type source layer 47 selectively formed in the P-type base layer 45 so as to be adjacent to it, an $N^+$-type drain layer 41 which is the same as the $N^+$-type source layer 41 of the MOSFET described above and separated from the $N^+$-type source layer 47 with the P-type base layer 45 being interposed between them, and a $P^-$-type gate-to-drain offset layer 46 formed between the P-type base layer 45 and the $N^+$-type drain layer 41 so as to be adjacent to them. A gate electrode 52 is formed above the P-type base layer 45.

These two MOSFETs connected in series as described above function as one MOSFET having one $N^+$-type drain layer 44, one $N^+$-type source layer 47, and two gate electrodes 51 and 52.

Figure 6:
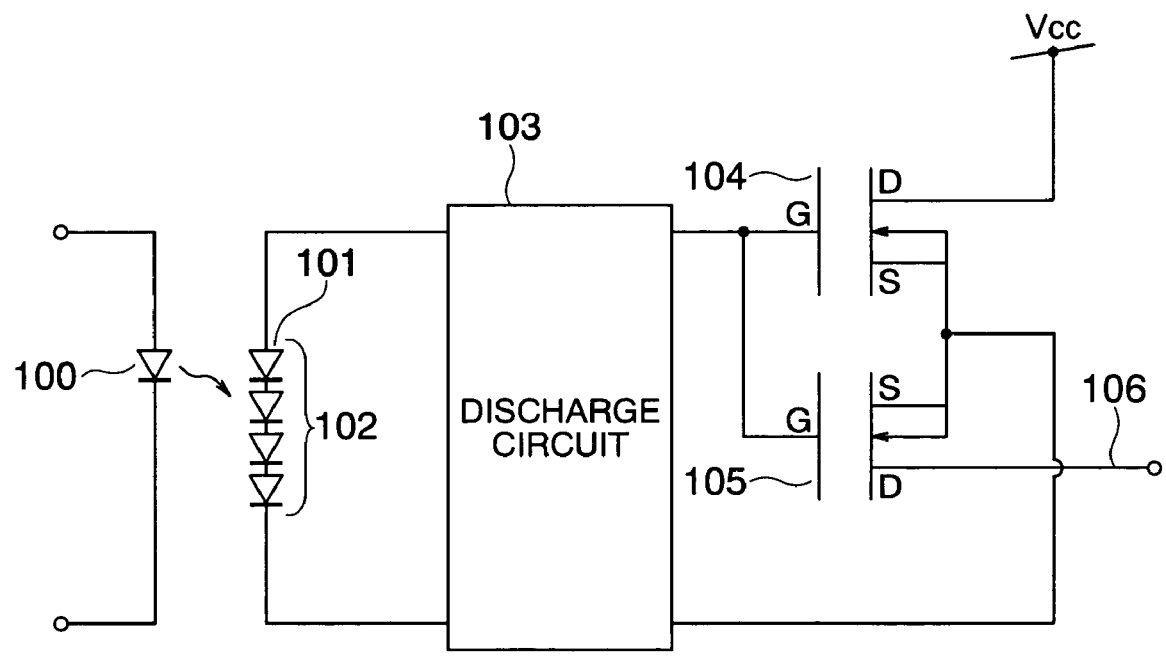
FIG. 6 is a circuit diagram showing the circuit configuration of a photo relay according to the third embodiment of the present invention formed by using the field-effect transistor according to the first or second embodiment.

The fourth embodiment and its first and second modifications can be applied as an integrated device of the two MOSFETs 104 and 105 shown in FIG. 6. This is equivalent to integrating the sources of the MOSFETs 104 and 105.

By contrast, in the third modification, the two MOSFETs are connected in series, so the two gates exist. However, these two MOSFETs substantially function as one MOSFET. Accordingly, these two MOSFETs of the third modification can be applied to the MOSFETs 104 and 105.

In each of the first, second, and third modifications, as in the first to fourth embodiments described above, it is possible to reduce the ON resistance Ron and OFF capacitance Cout, and increase the element breakdown voltage.

In the field-effect transistors, semiconductor devices, and photo relays according to the embodiments described above, the strained silicon layer increases the carrier mobility and reduces the ON resistance. In addition, the first-conductivity-type, high-resistance semiconductor layer formed in a region interposed between the first-conductivity-type base layer and the second-conductivity-type drain layer increases the element breakdown voltage and reduces the OFF capacitance.

The above embodiments are merely examples and do not limit the present invention. Therefore, these embodiments can be variously modified within the technical scope of the present invention.

For example, the conductivity types in the above embodiments may also be entirely inverted. Also, the material forming the strained silicon layer is not limited to silicon germanium.

In the strained silicon layer of each embodiment, at least the region where the base layer is formed or at least the region where the base layer and gate-to-drain offset layer are formed need only be the strained silicon layer. In each embodiment, the effects of the present invention described above can be obtained even though the regions where the source and drain layers are formed do not have the characteristics of the strained silicon layer when these layers are formed.

In the above embodiments, the conductivity type of the gate-to-drain offset layer is the same as the base layer and different from the source and drain layers. However, the conductivity type of the gate-to-drain offset layer may also be different from the base layer and the same as the source and drain layers.

That is, the P$^-$-type gate-to-drain offset layer between the P-type base layer and the N$^+$-type drain layer can be an N$^-$-type layer and can also be replaced with an intrinsic high-resistance layer.

In each of the above embodiments, the gate insulating film is not limited to the conventionally used thermal oxide film, but can be an SiON film, an oxide film, a nitride film, or a composite insulating film also including a film made of another material.

In each of the above embodiments, the silicon oxide films 11 and 31 are not limited to silicon oxide films but may also be insulating films made of other materials.

Furthermore, in the second modification shown in FIG. 9 and the third modification shown in FIG. 10, the semiconductor substrate is omitted, and the strained silicon layer is formed on the silicon oxide film. This structure from which the semiconductor substrate is omitted is applicable not only to the second and third modifications, but also to any of the first to third embodiments described above.

The application of the field-effect transistor of the present invention is explained by taking a photo relay as an example. However, this field-effect transistor may also be incorporated into a power circuit for controlling the power supply of an LSI or the like, or an analog switching circuit for controlling signals.

In each of the above embodiments, the first-conductivity-type base layer may also be made of a strained silicon layer, or formed by diffusing an impurity in the lateral direction after the gate insulating film is formed. In an element having an element breakdown voltage to a certain degree, the ON resistance, gate threshold value, and element breakdown voltage can be well designed by forming the first-conductivity-type base layer by lateral diffusion.

Also, a semiconductor device as a modification of each of the above embodiments is characterized in that the semiconductor device has a semiconductor structure which uses a strained silicon layer as an SOI layer, and a voltage (Vg) to be applied to the gate of each transistor to turn on this semiconductor device is set lower than a field breakdown limit Emax of the corresponding gate insulating film, and equal to or higher than the breakdown voltage between the corresponding source layer and the corresponding drain layer.

The effects of this semiconductor device will be explained below.

The output capacitance (Cout) of one SOI-MOSFET is approximated by $$Cout \approx Cgd + Csd + Cds1 + C0$$

as the sum of the gate-to-drain capacitance (Cgd), the drain-to-source capacitance (junction capacitance) (Csd), the drain-to-source capacitance (a capacitance except for the junction capacitance) (Cds1), and the capacitance (C0) of the package and the like.

The drain-to-source capacitance (junction capacitance) (Csd) can be well decreased by using a thin SOI film. It is also possible to decrease the drain-to-source capacitance (a capacitance except for the junction capacitance) (Cds1) and the capacitance (C0) of the package and the like by using pattern design or some other method. However, the gate-to-drain capacitance (Cgd) is difficult to reduce.

Possible methods of decreasing this capacitance (Cgd) are:

(a) increase the thickness of the gate insulating film; and (b) increase the distance between the gate electrode and the drain layer.

Unfortunately, each of methods (a) and (b) described above significantly increases the ON resistance (Ron) of the element.

When strained silicon is used as SOI, therefore, the mobility of the MOS channel inversion layer increases, and this decreases the ON resistance (Ron). This makes it possible to cancel the increase in ON resistance (on) when method (a) or (b) is used, and reduce the CR product.

In a transistor whose purpose is to amplify a voltage or electric current, the CR product can be further reduced by design opposite to this purpose. More specifically, the CR product can be further reduced by driving the transistor by a gate voltage equal to or higher than the rated drain-to-source breakdown voltage, i.e., by stably driving the transistor at a gate voltage equal to or twice, three times, or more the rated drain-to-source breakdown voltage.

This gate voltage higher than the element rated voltage can be supplied from a light-receiving chip in a photo relay, or by boosting a voltage obtained from another low-voltage power supply by using, e.g., a DC-DC converter circuit.

Furthermore, the voltage higher than the element rated voltage can be obtained by integrating this DC-DC converter circuit in the chip of the semiconductor device or photo relay of the present invention.

The invention claimed is:

1. A field-effect transistor comprising:
   a silicon layer formed on an insulating film;
   a first-conductivity-type base layer formed in said silicon layer;
   a second-conductivity-type source layer formed in said silicon layer so as to be adjacent to said first-conductivity-type base layer;
   a second-conductivity-type drain layer formed in said silicon layer so as to be separated from said second-conductivity-type source layer with said first-conductivity-type base layer being interposed therebetween;
   a gate-to drain offset layer formed between said first-conductivity-type base layer and said second-conductivity-type drain layer in said silicon layer, and having a resistance higher than that of said first-conductivity-type base layer; and
   a gate electrode formed on at least a surface of said first-conductivity-type base layer via a gate insulating film,
   wherein said silicon layer in which said first-conductivity-type base layer is formed is a strained silicon layer.

2. A transistor according to claim 1, wherein said silicon layer in which said gate-to-drain offset layer is formed is a strained silicon layer.

3. A transistor according to claim 1, wherein said silicon layer is a strained silicon layer.

4. A transistor according to claim 1, wherein said second-conductivity-type source layer is selectively formed in a surface portion of said first-conductivity-type base layer.

5. A transistor according to claim 1, further comprising a silicon-germanium layer formed between said insulating film and said silicon layer.

6. A transistor according in claim 2, wherein
said gate electrode has a first portion positioned on a surface of said first-conductivity-type base layer, and a second portion positioned on a surface of said first-conductivity-type gate-to-drain offset layer, and
the second portion increases a distance to said strained silicon layer in a direction from a boundary between said first-conductivity-type base layer and said first-conductivity-type gate-to-drain offset layer to a boundary between said first-conductivity-type gate-to-drain offset layer and said second-conductivity type drain layer.

7. A transistor according to claim 1, wherein said gate-to-drain offset layer has a first-conductivity-type.

8. A semiconductor device comprising:
a semiconductor substrate;
an insulating film formed on said semiconductor substrate;
a silicon layer formed on said insulating film;
a first field-effect transistor comprising
a first first-conductivity-type base layer formed in said silicon layer,
a first second-conductivity-type source layer formed in said silicon layer so as to be adjacent to said first-conductivity-type base layer,
a first second-conductivity-type drain layer formed in said silicon layer so as to be separated from said first second-conductivity-type source layer with said first-conductivity-type base layer being interposed therebetween,
a first gate-to-drain offset layer formed between said first first-conductivity-type base layer and first second-conductivity-type drain layer in said silicon layer, and having a resistance higher than that of said first first-conductivity-type base layer, and
a first gate electrode formed on at least a surface of said first-conductivity-type base layer via a first gate insulating film; and
a second field-effect transistor comprising
said first second-conductivity-type source layer shared by said first field-effect transistor,
a second first-conductivity-type base layer formed in said silicon layer so as to be adjacent to said lust second-conductivity-type source layer,
a second-conductivity-type drain layer formed in said silicon layer so as to be separated from said first second-conductivity-type source layer with said second first-conductivity-type base layer being interposed therebetween,
a second gate-to-drain offset layer formed between said second first-conductivity-type base layer and second second-conductivity-type drain layer in said silicon layer, and having a resistance higher than that of said second first-conductivity-type base layer, and
a second gate electrode formed on at least a surface of said second first-conductivity-type base layer via a second gate insulating film,
wherein said silicon layer in which said first and second first-conductivity-type base layers are formed is a strained silicon layer.

9. A transistor according to claim 8, wherein said silicon layer in which said first and second gate-to-drain offset layers are formed is a strained silicon layer.

10. A transistor according to claim 8, wherein said silicon layer is a strained silicon layer.

11. A transistor according to claim 8, wherein said second-conductivity-type source layer is selectively formed in a surface portion of said first-conductivity-type base layer.

12. A semiconductor device comprising:
a semiconductor substrate;
an insulating film formed on said semiconductor substrate;
a silicon layer formed on said insulating film;
a first field-effect transistor comprising
a first first-conductivity-type base layer formed in said silicon layer,
a first second-conductivity-type layer as a first second-conductivity-type source layer formed in said silicon layer so as to be adjacent to said first-conductivity-type base layer,
a first second-conductivity-type drain layer formed in said silicon layer so as to be separated from said first second-conductivity-type layer with said first-conductivity-type base layer being interposed therebetween,
a first gate-to-drain offset layer formed between said first first-conductivity-type base layer and said first second-conductivity-type drain layer in said silicon layer, and having a resistance higher than that of said first first-conductivity-type base layer, and
a first gate electrode formed on at least a surface of said first first-conductivity-type base layer via a first gate insulating film; and
a second field-effect transistor comprising
said first second-conductivity-type layer, as a second second-conductivity-type drain layer, shared by said first field-effect transistor,
a second first-conductivity-type base layer formed in said silicon layer so as to be separated from said first second-conductivity-type layer,
a second second-conductivity-type source layer formed in said silicon layer so as to be adjacent to said second first-conductivity-type base layer and separated from said first second-conductivity-type layer with said second first-conductivity-type base layer being interposed therebetween,
a second gate-to-drain offset layer formed between said second first-conductivity-type base layer and said first second-conductivity-type layer in said silicon layer, and having a resistance higher than that of said second first-conductivity-type base layer, and
a second gate electrode formed on at least a surface of said second first-conductivity-type base layer via a second gate insulating film,
wherein said silicon layer in which said first and second first-conductivity-type base layers are formed is a strained silicon layer.

13. A device according to claim 12, wherein said silicon layer in which said first and second gate-to-drain offset layers are formed is a strained silicon layer.

14. A device according to claim 12, wherein said silicon layer is a strained silicon layer.

15. A device according to claim 8, further comprising a silicon-germanium layer formed between said insulating film and said silicon layer.

16. A device according to claim 12, further comprising a silicon-germanium layer formed between said insulating film and said silicon layer.

17. A device according to claim 8, wherein said first and second gate-to-drain offset layers have a first conductivity type.

18. A device according to claim 12, wherein said first and second gate-to-drain offset layers have a first conductivity type.

19. A device according to claim 1, wherein
when the transistor is to be turned on, a voltage (Vg) applied to said first gate electrode is not more than a field breakdown limit Emax of said gate insulating film, and nor less than a breakdown voltage between said second-conductivity-type source layer and said second-conductivity-type drain layer.

20. A device according to claim 8, wherein
when the semiconductor device is to be turned on, a voltage (Vg 1) applied to said first gate electrode is not more than a field breakdown limit Emax 1 of said first gate insulating film, and not less than a breakdown voltage between said first second-conductivity-type source layer and said first second-conductivity-type drain layer, and
a voltage (Vg 2) applied to said second gate electrode is not more than a field breakdown limit Emax 2 of said second gate insulating film, and not less than a breakdown voltage between said first second-conductivity-type source layer and said second second-conductivity-type drain layer.

21. A device according to claim 12, wherein
when the semiconductor device is to be turned on, a voltage (Vg 1) applied to said first gate electrode is not more than a field breakdown limit Emax 1 of said first gate insulating film, and not less than a breakdown voltage between said first second-conductivity-type layer and said first second-conductivity-type drain layer, and
a voltage (Vg 2) applied to said second gate electrode is not more than a field breakdown limit Emax 2 of said second gate insulating film, and not less than a breakdown voltage between said second second-conductivity-type source layer and said first second-conductivity-type layer.

22. A photo relay comprising:
a light-emitting element which emits light when a switching control signal is input;
a light-receiving element which receives the light emitted by said light-emitting element, and generates a light-receiving voltage:
first and second field-effect transistors which are turned on or off in accordance with the light-receiving voltage, each of said first and second field-effect transistor comprising
an insulating him formed on a semiconductor substrate, and
a silicon layer formed on said insulating film;
a first-conductivity-type base layer formed in said silicon layer;
a second-conductivity-type source layer formed in said silicon layer so as to be adjacent to said first-conductivity-type base layer;
a second-conductivity-type drain layer formed in said silicon layer so as to be separated from said second-conductivity-type source layer with said first-conductivity-type base layer being interposed therebetween;
a gate-to-drain offset layer formed between said first-conductivity-type base layer and said second-conductivity-type drain layer in said silicon layer, and having a resistance higher than that of said first-conductivity-type base layer; and
a gate electrode formed on at least a surface of said first-conductivity-type base layer via a gate insulating film,
wherein said silicon layer in which said first-conductivity-type base layer is formed is a strained silicon layer, and
said second-conductivity-type source layers of said first and second field-effect transistors are connected together, said gate electrodes of said first and second field-effect transistor are connected together, and said first and second field-effect transistors are turned on or off in accordance with the light-receiving voltage applied between said second-conductivity-type source layers and said gate electrodes.

23. A photo relay according to claim 22, wherein said silicon layer in which said gate-to drain offset layer is formed is a strained silicon layer.

24. A photo relay according to claim 22, wherein said silicon layer is a strained silicon layer.

25. A photo relay according to claim 22, further comprising a silicon-germanium layer formed between said insulating film and said silicon layer.

26. A photo relay field transistor according to claim 1, wherein said first-conductivity-type base layer is formed by diffusing an impurity in a lateral direction.

27. A semiconductor device according to claim 8, wherein said first and second first-conductivity-type base layers are formed by diffusing an impurity in a lateral direction.

28. A semiconductor device according to claim 12, wherein said first and second first-conductivity-type base layers are formed by diffusing an in purity in a lateral direction.

29. A photo relay according to claim 22, wherein said first-conductivity-type base layer is formed by diffusing an impurity in a lateral direction.

30. A photo relay according to claim 22, wherein said gate-to-drain offset layer has a first conductivity type.

* * * * *

UNITED STATES PATENT AND TRADEMARK OFFICE
CERTIFICATE OF CORRECTION

PATENT NO. : 7,145,169 B2
APPLICATION NO. : 11/001640
DATED : December 5, 2006
INVENTOR(S) : Ryujiro Saso et al.

It is certified that error appears in the above-identified patent and that said Letters Patent is hereby corrected as shown below:

On the Title page, References Cited section (56), U.S. Patent Documents:
    Please insert the following references:
--5,534,735    07/1996    Baba et al
  5,627,394    05/1997    Chang et al
  6,239,483    08/2001    Williams et al
  6,603,156    08/2003    Rim
  6,657,223    12/2003    Wang et al--

On the Title page, References Cited section (56), Foreign Patent Documents:
    Please insert the following references:
--JP    09-312392    12/1997
  JP    11-186562    07/1999
  JP    2004-006731    01/2004--

On the Title page, References Cited section (56), Other Publications:
    Please insert the following reference:
--Lauer et al., "Fully Depleted n-MOSFETs on Supercritical Thickness Strained SOI", IEE Electron Device Letters, Vol. 25, No. 2, February 2004, pg. 83-85--

In Column 11, Claim 8, Line 56:
    Please change "lust" to --first--

In Column 13, Claim 19, Line 17:
    Please change "nor" to --not--

In Column 14, Claim 22, Line 1:
    Please change "him" to --film--

In Column 14, Claim 26, Line 40:
    Please change "photo relay field transistor" to --field-effect transistor--

UNITED STATES PATENT AND TRADEMARK OFFICE
CERTIFICATE OF CORRECTION

PATENT NO.       : 7,145,169 B2
APPLICATION NO.  : 11/001640
DATED            : December 5, 2006
INVENTOR(S)      : Ryujiro Saso et al.

It is certified that error appears in the above-identified patent and that said Letters Patent is hereby corrected as shown below:

In Column 14, Claim 28, Line 49:
    Please change "in purity" to --impurity--

Signed and Sealed this

Twenty-ninth Day of May, 2007

JON W. DUDAS
*Director of the United States Patent and Trademark Office*